(12) United States Patent
Bickerstaff

(10) Patent No.: US 7,200,798 B2
(45) Date of Patent: Apr. 3, 2007

(54) UNIFIED SERIAL/PARALLEL CONCATENATED CONVOLUTIONAL CODE DECODER ARCHITECTURE AND METHOD

(75) Inventor: Mark Andrew Bickerstaff, Carlingford (AU)

(73) Assignee: Lucent Technologies Inc., Murray Hill, NJ (US)

( * ) Notice: Subject to any disclaimer, the term of this patent is extended or adjusted under 35 U.S.C. 154(b) by 460 days.

(21) Appl. No.: 10/608,831

(22) Filed: Jun. 26, 2003

(65) Prior Publication Data

US 2005/0010854 A1    Jan. 13, 2005

(51) Int. Cl.
*H03M 13/03* (2006.01)
(52) U.S. Cl. ..................................... 714/794
(58) Field of Classification Search ................. 714/786
See application file for complete search history.

(56) References Cited

U.S. PATENT DOCUMENTS

| | | | |
|---|---|---|---|
| 6,807,239 B2 * | 10/2004 | Sugimoto et al. ........... | 375/341 |
| 6,851,039 B2 | 2/2005 | Bickerstaff | |
| 6,865,710 B2 | 3/2005 | Bickerstaff et al. | |
| 2002/0162074 A1 | 10/2002 | Bickerstaff | |
| 2003/0005388 A1 * | 1/2003 | Fukumasa ................... | 714/786 |
| 2003/0101402 A1 * | 5/2003 | Amrani et al. .............. | 714/755 |
| 2003/0118122 A1 * | 6/2003 | Nefedov ..................... | 375/265 |
| 2004/0025102 A1 * | 2/2004 | Yokokawa et al. ......... | 714/755 |
| 2004/0044946 A1 | 3/2004 | Bickerstaff et al. | |

OTHER PUBLICATIONS

Bickerstaff et al. A Unified Turbo/Viterbi Channel Decoder for 3GPP Mobile Wireless in 0.18 um CMOS. pp. 1555-1564. IEEE journal of Solid-State Circuits, vol. 37, No. 11, Nov. 2002.*
Bickerstaff et al. A unified Turbo/Viterbi Channel Decoder for 3GPP Mobile wireless in 0.18-um CMOS. IEE Journal of solid-state circuits, vol. 37, No. 11, Nov. 2002, pp. 1555-1564.*
Press relaes, Lucent Technologies unveils chip innovation from bell labs that improves performance and reduce cost for 3G mobile networks, Apr. 15, 2002.*
Allan, Gord A 2.5 mW—10 Mbps low area MAP decoder, pp. 1-15, May 7, 2002.*

* cited by examiner

*Primary Examiner*—Guy Lamarre
*Assistant Examiner*—Sam Rizk

(57) ABSTRACT

A turbo decoder having two modes of operation decodes received information as per an N-state Radix-K trellis where N and K are integers equal to 1 or greater. The turbo decoder uses an in-line addressing technique that allows it to operate as a Serial Convolutional Code decoder in the first mode of operation and a Parallel Convolutional Code decoder in the second mode of operation. The decoder uses an in line addressing technique that allows it to use the same block of memory to store and retrieve states of the trellis as it processes received information. The turbo decoder can also operate as per an N-state Radix-K trellis where N is an integer equal to 2 or greater and K is an integer equal to 4 or greater.

15 Claims, 8 Drawing Sheets

UNIFIED SERIAL/PARALLEL CONCATENATED CONVOLUTIONAL CODE DECODER ARCHITECTURE AND METHOD

BACKGROUND OF THE INVENTION

1. Field of the Invention

The present invention generally relates to channel coding used in communication systems and particularly in wireless communication systems.

2. Description of the Related Art

Channel coding is a well known technique used in communication systems to combat adverse effects of noise on transmitted signals propagating through communication channels of the communication systems. One type of channel coding is known as Forward Error Correction coding in which information prior to being transmitted over a particular channel is processed so as to better withstand the anomalous effects of the channel. The channel coding adds redundancy to the information to improve the probability that the information is properly decoded once received. The channel coding that is used can be any well known type of information coding such as Block codes or convolutional codes. Convolutional coding is a mapping of the information bits (to be transmitted) to encoder bits. The encoder is a particular processor that operates in accordance with a specific coding scheme usually represented by a state diagram commonly referred to as a trellis. The trellis shows the different states that the encoder has and how the encoder moves from one set of states to another set of states as it is processing the information. The possible transitions from one set of states to other sets of states are shown by the trellis. Thus, the encoder operates (i.e., moves from a set of states to another set of states) as per the trellis. In sum, at a particular point in time, the coder has a certain number of states each of which has a particular value and each such state can transition to one or more other states.

Convolutional codes which are generated in recursive fashion are known as concatenated convolutional codes or Turbo codes. The concatenated convolutional coding can be performed either serially (Serial Concatenated Convolutional Coding or SCCC) or in parallel fashion (Parallel Concatenated Convolutional Coding or PCCC). SCCC and PCCC coders and/or decoders are referred to as Turbo coders and decoders. A turbo decoder is a device that is used to decode information that has been encoded by a turbo encoder and possibly has been processed by other coding devices. Referring to FIG. 1 there is shown an example of a turbo encoder 100 comprising two substantially identical Recursive System Coders (RSC) 102, 106 and one interleaver 104. Interleaver 104 operates as any well known interleaver which alters the time order of the information bits applied to it. The turbo coder of FIG. 1 generates a codeword comprising a systematic bit and two parity bits. The systematic bit is essentially an information bit.

Referring now to FIG. 2, there is shown a standard configuration for a turbo decoder. Turbo decoder 200 comprises SISO (Soft Input Soft Output) devices 202 and 206. A SISO device receives soft information, processes such information in accordance with a particular algorithm or processing method and outputs soft information that can be used to make a hard decision about the received information or can be used for further processing. The soft information is probability data on the received information where such data give an indication of the confidence that is to be attributed to the value of the received information. For example, if the received information was decoded to be a "0" bit, the soft information associated with that received information gives an indication of how likely that the original information was indeed a "0"bit. The SISO device also generates additional soft information as it is processing the input information; the difference between the additional generated soft information and the soft information at the input is called extrinsic information. In many applications where a SISO device is used, the extrinsic information is recursively inputted as soft input information to allow the SISO to generate more reliable soft information about a particular received information. The SISO devices may process the soft information in accordance with a well known algorithm called the Log MAP (Maximum A Posteriori) algorithm. When the SISO devices process soft information as per the Log MAP algorithm, they are called Log MAP processors.

The Log MAP algorithm is a recursive algorithm for calculating the probability of a processing device being in a particular state at a given time based on received information. The probabilities are calculated by forward recursions and backward recursions over a defined time window or a block of information. The Log MAP algorithm essentially is the recursive calculation of probabilities of being in certain states based on received information and the a priori probabilities of going to specific states from particular states. The states describe the condition of a process that generates the information that is ultimately received. The LogMAP algorithm and how a LogMAP processor operates are often represented by a trellis which has a certain number of states. Each state has a probability associated with it and transition probabilities indicating the likelihood of transitioning from one state to another state either forward or backward in time. In general each state in a trellis has a number of transition probabilities entering it and leaving it. The number of probabilities entering or leaving states of a trellis is referred to as the radix. Thus in a Radix-2 trellis, each state has two entering and two exiting transition probabilities. The trellis shows the possible transition between states over time. In general a Radix-K trellis has K branches entering and K branches leaving each state in the trellis. The output of the Log MAP algorithm is called the LLR (Log Likelihood Ratio) which represents the probability that the original information (i.e., information prior to exposure to any noisy environment and prior to any processing) was a certain value. For example, for digital information, the LLR represents the probability that the original information was either a "0" bit or a "1" bit given all of the received data or observations.

Still referring to FIG. 2, turbo decoder 200 further comprises interleaver 204 and deinterleaver 208. Deinterleaver 208 performs a reverse interleaving operation. Received samples $Y_{P_1}$ and $Y_S$ are applied to Log MAP processor 202 and received sample $Y_{P_2}$ is applied to LogMAP processor 206 as shown. Turbo decoder 200 generates a Log Likelihood output. Interleaver 204, deinterleaver 208 and Log-MAP processors 202 and 206 all share buffers and memory locations to retrieve and store extrinsic information. Boundary 210 symbolically represents the two memory spaces (for interleaver 204, deinterleaver 208 and the LogMAP processors) which are addressed differently. The side of boundary 210 where LogMAP processor 202 is located has memory for storing extrinsic information where such information is stored in memory having sequential memory addresses. In other words, the information that is to be retrieved is located in contiguous memory locations. However, because of the alteration in the time order of extrinsic information stored on the other side of boundary 210 (i.e., side where LogMAP processor 206 is located), the extrinsic information is not retrieved from sequential memory locations; unlike the sequential case where only one memory address need be known and the other memory address is simply the next higher address, two distinct memory addresses are used to retrieve the extrinsic information.

The retrieval of information from two memory addresses in a sequential manner therefore reduces the speed of operation of the turbo decoder. To resolve this decrease in speed of operation, the extrinsic memory is replicated a certain number of times depending on the radix value of the turbo decoder. For example, for a Radix-4 turbo decoder, the extrinsic memory is duplicated. For a Radix-8 turbo decoder, there are three blocks of extrinsic memory with same addresses and same contents. In general, for a Radix-K turbo decoder there are $\log_2$ K blocks of extrinsic information memory where all of them have the same addresses and the same contents stored at the addresses; that is the extrinsic memory is replicated and corresponding memory addresses contain identical information at all times. In this manner multiple retrieval of extrinsic information can be done at a particular instant. Note that the multiple addresses generated can have the same value, but the actual values retrieved will be from different memory blocks. The replicated extrinsic information memories are independent of each other meaning that accessing information from one extrinsic memory does not, in any manner, affect any other extrinsic memory.

As the design of wireless communication systems evolves into systems with relatively higher data rates, a need has risen to process more information per clock cycle. A clock cycle is a unit processing time for a processor such as a Turbo coder or decoder. Turbo coding and decoding has evolved as the channel coding of choice in many wireless communication systems.

Referring to FIG. 3 there is shown a Parallel Concatenated Convolution Code (PCCC) decoder 300. PCCC decoder 300 comprises deinterleaver 302 coupled to Soft Input Soft Output (SISO) decoder 304 which is coupled to interleaver 306. Deinterleaver 302 performs the reverse operation of interleaving; that is, interleaved information is reordered so that the information returns to its original order. The turbo decoder of FIG. 3 processes codewords received over a communication channel to soft outputs and/or information bits. SISO device 304 receives soft information, processes such information in accordance with a particular algorithm (e.g., Log MAP algorithm) or processing method and outputs soft information that can be used to make a hard decision about the received information or can be used for further processing. The SISO device can process the received codewords in accordance with the well known Log MAP algorithm; in such a case, the SISO device is referred to as a Log MAP processor. Typically a Log MAP processor has a radix-2 trellis meaning that it processes states that have two entering transition probabilities and two exiting transition probabilities. A radix-2 trellis processes one bit per unit time. To satisfy the need for higher capacity communication systems, the known art has developed higher radix turbo decoders that can process relatively more information per unit time than radix-2 turbo decoders.

In particular, the known art has an N-state radix-K turbo decoder using the PCCC architecture where N is a power of 2 integer equal to 2 or greater and K is an integer equal to 4 or greater. Referring to FIG. 4, there is shown an 8-state radix-4 trellis under which the turbo decoder of FIG. 3 operates. Note that $\alpha_t^j$, which is called a forward path metric, represents the probability of being in state j at time t for a forward recursion; $\beta_t^j$, which is called a backward path metric, also represents the probability of being in state j at time t given the received information. Also, although not shown in FIG. 4, associated with the trellis are branch metrics; $\gamma_t^{i,k}$ is a branch metric which represent the probability of observing the received information given the transition from state i to state k and arriving at state k at time t. The PCCC turbo decoder shown in FIG. 3 and in particular SISO processor 304 operates as per trellis of FIG. 4 and SISO has an internal structure shown in FIG. 5.

The SISO processor shown in FIG. 5 comprises Branch Metric Calculator (BMC) 502 in communication with Path Metric Calculators (PMC) 504 and 506 which are coupled to Log Likelihood (LL) calculators 508 and 510 via path metric buffers 512 and 514. The calculated branch metrics for different times are stored in buffers 501 and 503. The branch metrics are calculated for a stream of information partitioned into time windows. As shown in FIG. 4, the current time window is W time units in length where W is an integer. The branch metrics are calculated from input symbols applied to input buffer 505 and from soft information processed by interleaver/deinterleaver 526. The input symbols are the codewords received by the turbo decoder.

The LL calculators use the calculated path metrics to calculate log likelihood transition terms. The LL calculators are coupled to subtracting circuits to calculate the difference between their outputs and an extrinsic information (i.e., a type of soft information) input resulting in a Log Likelihood Ratio (LLR) output. LLR circuits 516 and 518 are subtractor circuits; they calculate the difference between log likelihood transition terms and extrinsic information stored in FIFO (First In First Out memory) 519. The LLR outputs are stored into output buffer 524 which provides decoded bits. The LLR outputs when not construed as decoded bits are applied to interleaver/deinterleaver circuit 526 comprising interleaver/deinterleaver address generator 520 coupled interleaver/deinterleaver 522. Circuit 526 thus operates as either an interleaver or deinterleaver. The LL calculators 508 and 510 and path metric calculators are constructed with Log Sum operators designed with an Add Compare Select (ACS) architecture.

The ACS architecture is based on a definition of the Log Sum operation called the Jacobian relationship; the ACS architecture uses an approximation of the Jacobian relationship. The Jacobian relationship defines a Log Sum operation in which a Log Sum operator logarithmically combines sums of branch metrics and path metrics. The Log Sum operation for inputs $A_1$, $A_2$, $A_3$, and $A_4$ is defined by the Jacobian relationship as follows:

Log Sum$(A_1,A_2,A_3, \ldots )$=max $(A_1,A_2,A_3, \ldots )+f$ $(A_1,A_2, A_3, \ldots )$ where $f(A_1,A_2,A_3, \ldots )$=log (exp$(-\Delta_1)$+exp $(-\Delta_2)$+exp $(-\Delta_3)+ \ldots )$ where $\Delta_i=A_i$-min $(A_1,A_2,A_3, \ldots )$.

Referring to FIGS. 6A and 6B there is shown an SCCC encoder and decoder respectively. SCCC encoder of FIG. 6A comprises outer RSC 602 coupled interleaver 604 which is coupled to inner RSC 606. RSC 602 is different from RSC 606 in that it operates (i.e., encodes information applied to it) in accordance with a trellis having a certain number of states that is different than the number of states of the trellis which is used by inner RSC 606. For example, RSC 602 may operate as per a 16-state trellis whereas RSC 606 operates as per a 4-state trellis. Because the RSC's are necessarily different two separate such circuits are to be built for an SCCC coder. Similarly, FIG. 6B shows an architecture for an SCCC decoder comprising Inner SISO 608 coupled to Outer SISO 614 via Interleaver 610 and Deinterleaver 612. As with the RSC's, the Inner and Outer SISO's operate in accordance with different trellises having different number of states. Therefore, depending on the requirements of the communication system within which the decoder is to be used, different decoders have to be built for different requirements.

Not only are the SISO's for a particular SCCC decoder are different, but different decoders may have to be designed for different parts (i.e., different communication channels) of a communication system. Further, because the inner SISO and the outer SISO operate as per different trellises each such SISO necessarily will use different memories to perform its decoding operation. In sum, the requirements for a communication system result in burdensome equipment and design specifications for communication system designers who may have to build a plurality of specific SCCC coders and decoders to meet such requirements. As a response to the burdensome requirements of different SCCC coders and decoders the known art has developed a technique for processing the information as per a trellis regardless of the number of states contained in the trellis. Further, the same hardware or processing equipment can be used to process information using different types of trellises.

Referring to FIG. 7 there is shown a 32-state trellis depicting the possible transition of the states from time t to time t+1. A state at time t is represented by $S_t$ and one time unit later at time t+1 each state is represented as $S_{t+1}$. The same trellis is depicted in another format called the "butterfly." The particular example to be discussed uses a technique called "in-place addressing" applied to an SCCC decoder where 8 states from the trellis are processed during a clock cycle. A clock cycle represents the basic unit time period. The example describes the processing of forward path metrics as per a 32-state trellis and is depicted in FIG. 8. Backward path metrics can also use the in place addressing technique.

The technique, referred to as in-place addressing, uses the same memory locations to read and write path metric values as information applied to a decoder is being processed as per a particular trellis. The technique is able to process information as per different trellises having different number of states. Thus, for example, the equipment can be configured to implement the SISO processors can be processing information as per a 16-state trellis and the same equipment can be reconfigured for processing other information as per a 4-state trellis. The ability for a SISO processor to process information differently at different times reduces significantly the burdensome equipment requirements of SCCC decoders. Further the in-place addressing technique allows a turbo decoder to process a portion of the states of the trellis during a particular clock cycle; this allows processing of information as per an N-state trellis—where N is a relatively large number—without the need for burdensome equipment (i.e., hardware and/or software) requirement. N is a power of 2 integer equal to 2 or greater.

In FIG. 8, the memory locations for each of the 32 states are labeled accordingly in the SOURCE memory block. The SOURCE memory block is divided into four columns (cols. I–IV) where each column contains 8 memory locations and each column is divided into an upper portion and a lower portion. For example, for column I, the upper portion contains memory locations 0–3 and the lower portion contains memory locations 4–7. The memory locations represent states of a trellis that contain values for path metrics. The DESTINATION memory block is the same memory block used for the SOURCE memory block. A separate DESTINATION memory block is shown only for facilitating the explanation on how the in place addressing technique is achieved; in fact only one block of memory is used. As information is processed as per a trellis structure such as the butterfly structure shown in FIG. 7, the trellis determines the destination state for each of the starting states in the SOURCE memory block. In FIG. 8, the destination states or new states are shown by the BUTTERFLY mapping for each of the four groups of 8 states. The goal of the in-place addressing technique is to rearrange each group of 8 new states into their original order and store these rearranged new states in the same memory block from which they were retrieved thereby allowing the SISO device to process different size trellises using the same memory blocks. In short the same memory block is used for storing SOURCE states and DESTINATION states at different times. The SOURCE states are retrieved from a memory block and the DESTINATION states are stored in that same memory block. As the DESTINATION states (also called 'new states') are determined by the trellis structure, some of these states are temporarily stored in a HOLD register to allow each group of 8 states to be rearranged into their original order. Therefore, as shown in FIG. 8, each group of 8 states is retrieved and applied to a trellis circuit (e.g., digital combinatorial logic circuit) that determines the destination states and such destination states are stored back into the same memory block keeping the original order of each block of 8 states; maintaining the original order of a block of states is called 'the order requirement.' When a portion of the destination states are such that they cannot be stored back into the same block of memory due to the order requirement, the portion is stored temporarily in a hold register until it can be stored back into the same memory block in the proper locations so as to satisfy the order requirement. For the example given, 32 states are retrieved 8 states at a time from memory locations 0–31 and the resulting 32 new states are rewritten into the same memory locations 0–31 with each group of 8 new states complying with the order requirement. The particular steps in implementing the in-place addressing algorithm are shown in FIG. 8 as follows:

STEP 1A: empty HOLD register

STEP 1B: apply col. I to trellis circuit resulting in new states 0–3 and 16–19 as shown in the first column of the Butterfly mapping. Col. I is now ready to receive new states.

STEP 2A: store new states 0–3 in col. I upper.

STEP 2B: store new states 16–19 in HOLD register.

AT THIS POINT COL. I LOWER IS READY FOR NEW STATES 4–7 TO COMPLY WITH THE ORDER REQUIREMENT. NEW STATES 16–19 CANNOT BE STORED INTO COL. I LOWER BECAUSE THAT WOULD BE A VIOLATION OF THE ORDER REQUIREMENT. FURTHER NEW STATES 16–19 CANNOT BE STORED BACK INTO ANY OTHER COLUMNS BECAUSE THE OTHER COLUMNS HAVE NOT BEEN APPLIED TO THE TRELLIS CIRCUIT AND THUS CANNOT YET BE OVERWRITTEN WITH NEW STATES.

STEP 3A: apply col. II to trellis circuit resulting in new states 4–7 and 20–23. Col. II is now ready to receive new states.

STEP 3B: transfer new states 4–7 into col. I lower; col. I is now full with new states.

STEP 4A: transfer new states 16–19 from HOLD register to col. II upper.

STEP 4B: store new states 20–23 into HOLD register.

STEP 5A: apply col. III to trellis circuit resulting in new states 8–11 and 24–27. Col. III is now ready to receive new states.

STEP 5B: transfer new states 20–23 from HOLD register to col. II lower

STEP 5B: store new states 8–11 in col. III upper.

STEP 6A: store new states 24–27 in HOLD register.

STEP 6B: apply col. IV to trellis circuit resulting in new states 12–15 and 28–31. Col. IV is now ready to receive new states.

STEP 7A: store new states 12–15 into col. III lower; col. III is now full.

STEP 7B: transfer states 24–27 from HOLD register to col. IV upper. Store 28–31 into HOLD register.

STEP 8A: transfer new states 28–31 from HOLD register into col. IV lower; col. IV is now full.

The above description of the in-place addressing technique is for forward path metrics. A similar technique for backward path metrics can also be used where the SOURCE states are mapped into DESTINATION states as per a backward trellis structure similar to that shown in FIG. 7. Therefore, one memory block can be used to perform the trellis processing of a SISO for a particular trellis having a certain number of states.

Many state of the art wireless communication systems use turbo coding and decoding to process conveyed information. Some systems use SCCC while others use PCCC. It is desirable to use the PCCC decoder design described above because relatively more information can be processed per clock cycle resulting in relatively higher throughputs. At the same time, it is also desirable to use the in-place addressing technique described above because the same block of memory can be used to implement the inner and outer SISO processor resulting in an SCCC decoder that uses relatively less equipment.

SUMMARY OF THE INVENTION

The present invention provides an Serial/Parallel Concatenated Convolution Code (S/P-CCC) decoder that can operate as a Parallel Concatenated Convolutional Code decoder (PCCC) or a Serial Concatenated Convolutional Code (SCCC). The S/P-CCC decoder of the present invention comprises a Inner/Outer SISO processor that allows the decoder to have two modes of operation. The Inner/Outer SISO processor is coupled to an interleaver and a deinterleaver both of which exchange information with the Inner/Outer SISO processor.

In the first mode of operation, the S/P-CCC decoder of the present invention operates as a PCCC decoder whereby the SISO processor exchanges information with the interleaver and/or a deinterleaver and processes information as per a particular algorithm and outputs the result to an interleaver (deinterleaver) for further processing or can also output the result as a soft output from which information bits can be derived. The S/P-CCC decoder processes the information according to a trellis structure and also uses the in-place addressing technique for transitioning from one state to another state as per the trellis. The S/P-CCC decoder when operating as a PCCC turbo decoder causes the Inner/Outer SISO processor to retrieve information from the interleaver process the retrieved information and store it in the deinterleaver for further processing. Conversely, the Inner/Outer SISO also retrieves information from the deinterleaver processes the retrieved information and stores it in the interleaver for further processing.

In the second mode of operation, the S/P-CCC decoder of the present invention operates as an SCCC decoder that uses a technique of in-place addressing as it processes information as per a particular algorithm. As an SCCC decoder the Inner/Outer SISO processor of the decoder of the present invention processes information as per different trellises at different times using the in-place addressing technique. For example, the Inner/Outer SISO can operate as an inner SISO at one time and at a different time it can operate as an outer SISO; that is different trellises can be used to process information at different times. The inner SISO receives information from an interleaver and outputs information to a deinterleaver. The outer SISO receives information from the deinterleaver and outputs information to the interleaver. Information to be decoded is applied to the inner SISO and information that has been decoded is ouputted by the outer SISO. The architecture of the SISO processor is such that it processes information in accordance with an algorithm (e.g., Log MAP algorithm).

The S/P-CCC decoder of the present invention is thus able to process information in different manners depending on which mode under which it is operating. In both modes of operation the in place addressing technique is used.

DETAILED DESCRIPTION

The present invention provides an Serial/Parallel Concatenated Convolution Code (S/P-CCC) decoder that can operate as a Parallel Concatenated Convolutional Code decoder (PCCC) or a Serial Concatenated Convolutional Code (SCCC). The S/P-CCC decoder of the present invention comprises a Inner/Outer SISO processor that allows the decoder to have two modes of operation. The Inner/Outer SISO processor is coupled to an interleaver and a deinterleaver both of which exchange information with the Inner/Outer SISO processor.

In the first mode of operation, the S/P-CCC decoder of the present invention operates as a PCCC decoder whereby the SISO processor exchanges information with the interleaver and/or a deinterleaver and processes information as per a particular algorithm and outputs the result to an interleaver (deinterleaver) for further processing or can also output the result as a soft output from which information bits can be derived. The S/P-CCC decoder processes the information according to a trellis structure and also uses the in-place addressing technique for transitioning from one state to another state as per the trellis. The S/P-CCC decoder when operating as a PCCC turbo decoder causes the Inner/Outer SISO processor to retrieve information from the interleaver process the retrieved information and store it in the deinterleaver for further processing. Conversely, the Inner/Outer SISO also retrieves information from the deinterleaver processes the retrieved information and stores it in the interleaver for further processing.

In the second mode of operation, the S/P-CCC decoder of the present invention operates as an SCCC decoder that uses a technique of in-place addressing as it processes information as per a particular algorithm. As an SCCC decoder the Inner/Outer SISO processor of the decoder of the present invention processes information as per different trellises at different times using the in-place addressing technique. For example, the Inner/Outer SISO can operate as an inner SISO at one time and at a different time it can operate as an outer SISO; that is different trellises can be used to process information at different times. The inner SISO receives information from an interleaver and outputs information to a deinterleaver. The outer SISO receives information from the deinterleaver and outputs information to the interleaver. Information to be decoded is applied to the inner SISO and information that has been decoded is ouputted by the outer SISO. The architecture of the SISO processor is such that it processes information in accordance with an algorithm (e.g., Log MAP algorithm).

The S/P-CCC decoder of the present invention is thus able to process information in different manners depending on which mode under which it is operating. In both modes of operation the in place addressing technique is used.

Figure 9:
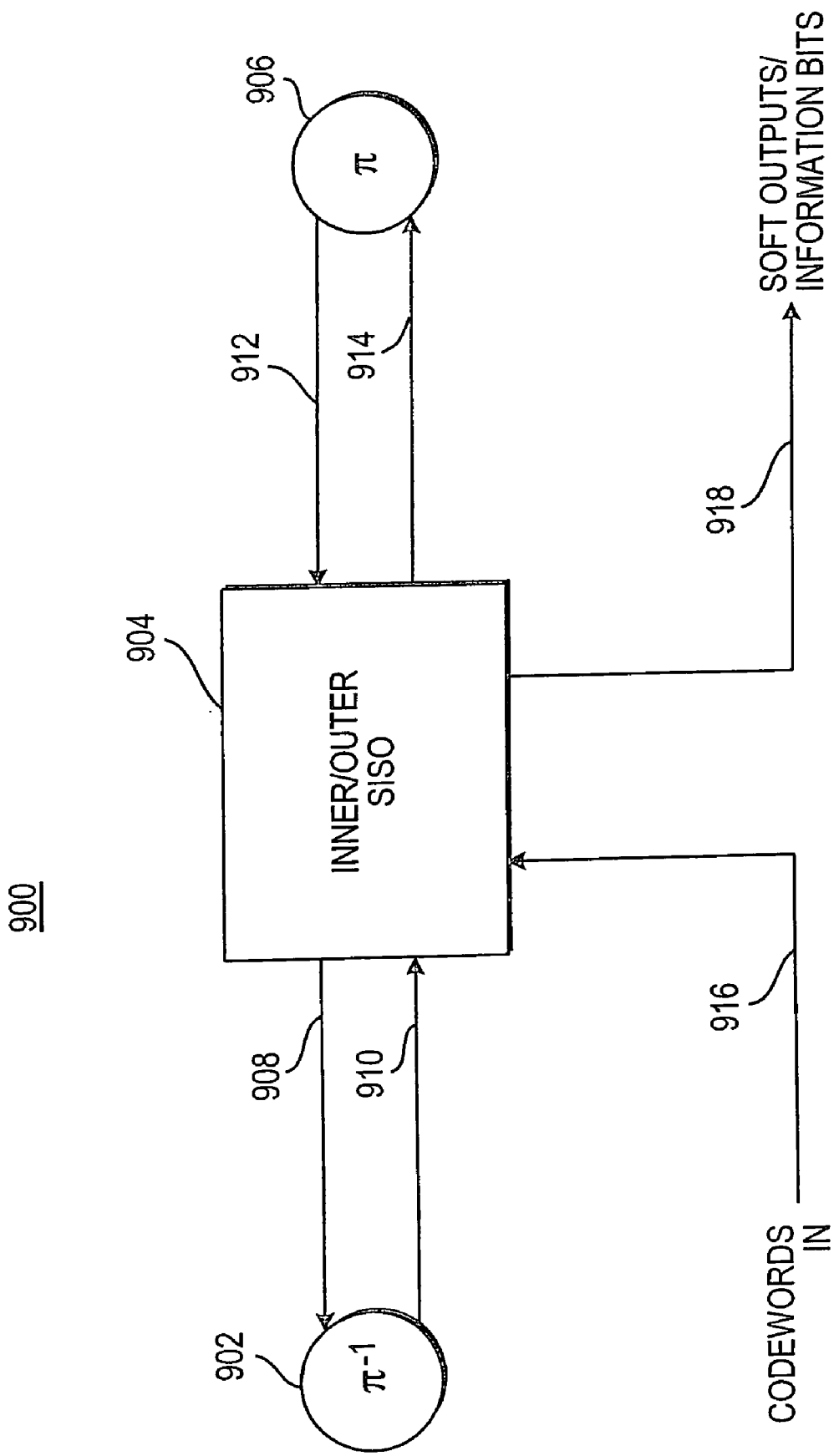
FIG. 9 is a block diagram of the turbo decoder of the present invention.

Referring to FIG. 9, there is shown the turbo decoder 900 of the present invention. Information is inputted into turbo decoder 900 via path 916 and soft outputs or information bits are outputted on path 918. The information is inputted in the form of codewords; the codewords are received via a communication channel and are applied onto path 916 for processing by Inner/Outer SISO 904. The S/P-CCC turbo decoder of the present invention comprises Inner/Outer SISO processor 904 coupled to deinterleaver 902 via paths 908 and 910. Inner/Outer SISO processor 904 is also coupled to interleaver 906 via paths 912 and 914. The configuration of Inner/Outer SISO processor 904 is such that it can process information in accordance with an algorithm such as the Log MAP algorithm. When using the Log MAP algorithm Inner/Outer SISO 904 becomes a Log MAP processor where it can operate in a manner substantially similar to the decoder shown in FIG. 2 for the first mode of operation.

Figure 1:
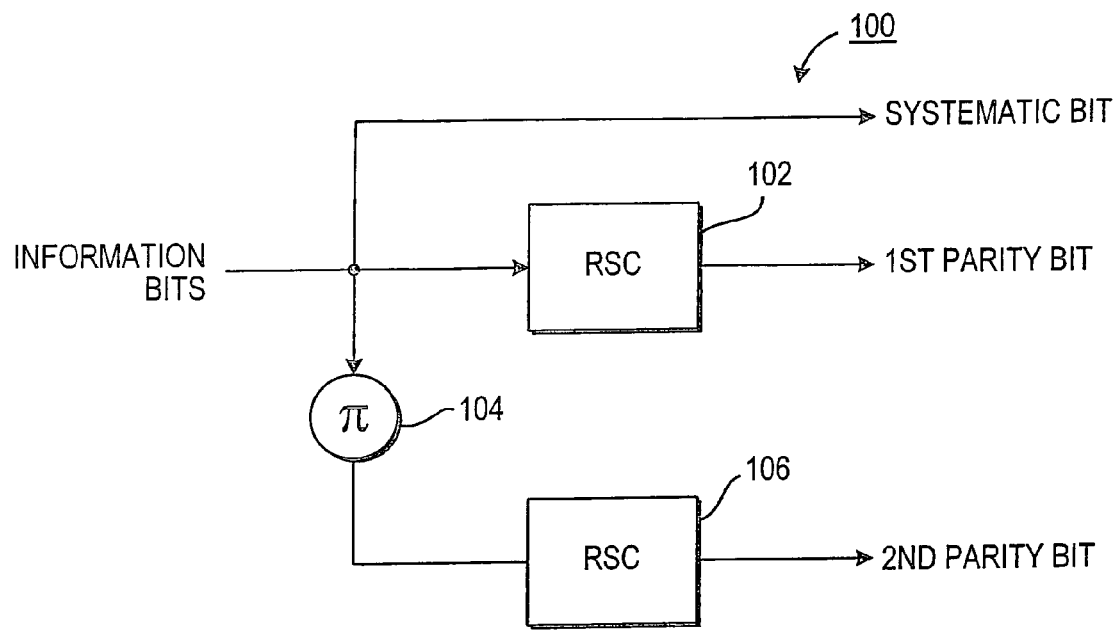
FIG. 1 shows the block diagram for a parallel turbo encoder.
Figure 2:
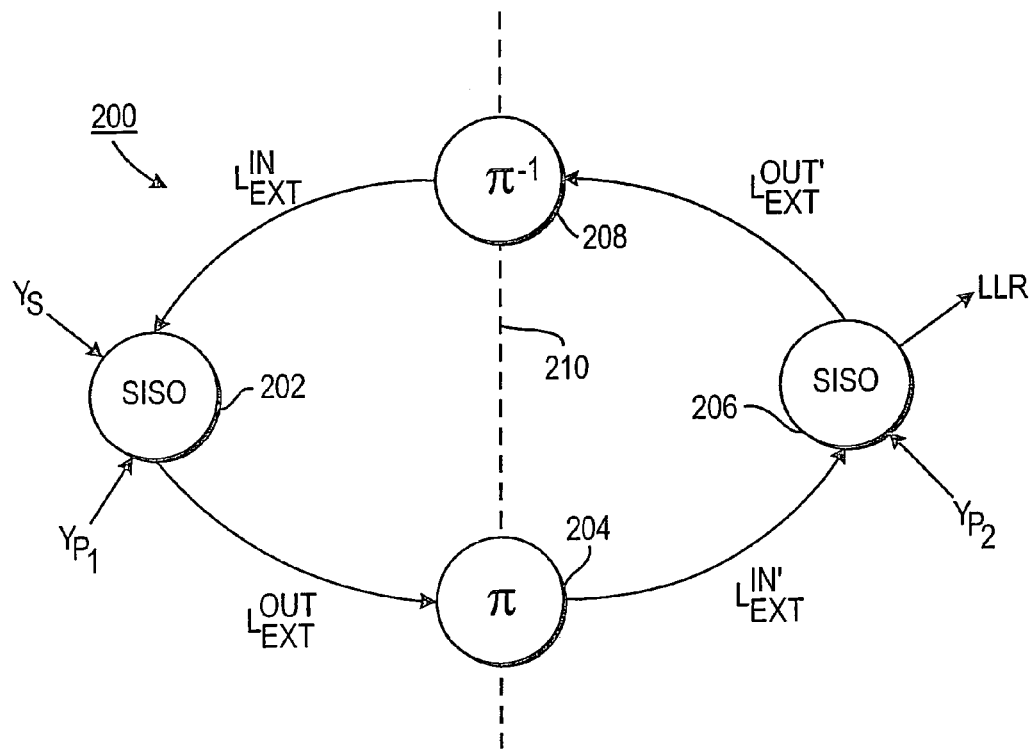
FIG. 2 shows the block diagram for a turbo decoder.

In the first mode, the turbo decoder of FIG. 9 operates as a PCCC decoder. FIG. 2 shows one particular embodiment of a PCCC decoder. In operating as the decoder shown in FIG. 2, Inner/Outer SISO 904 operates as a first SISO that receives soft information from deinterleaver 902 via path 910 and provides soft information to interleaver 906 via path 914. Inner/Outer SISO 904 also operates as a second SISO which receives soft information from interleaver 906 via path 912 and provides soft information to deinterleaver 902 via path 908. The first SISO has an input for receiving information (e.g., codewords) via path 916 and the second SISO has an output for generating information bits or soft information via path 918. The first and the second SISO operate as per two trellises; that is, the first SISO operates as per a first trellis and the second SISO operates as per a second trellis. Both trellises may have the same number of states and radices or different number of states and different radices. Inner/Outer SISO 904 uses the in place addressing technique in operating as the first and/or second SISO.

Figure 3:
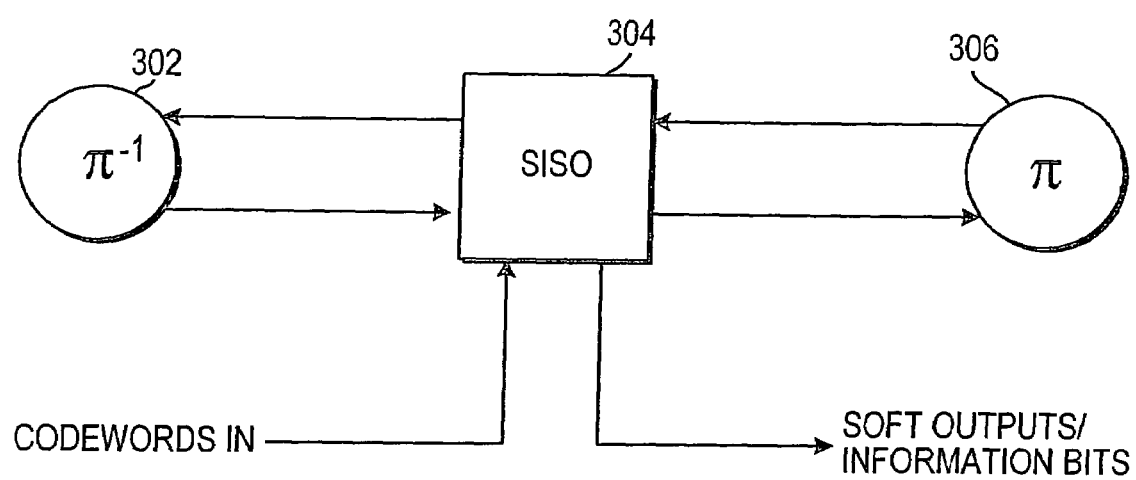
FIG. 3 shows the block diagram for a parallel turbo decoder.
Figure 4:
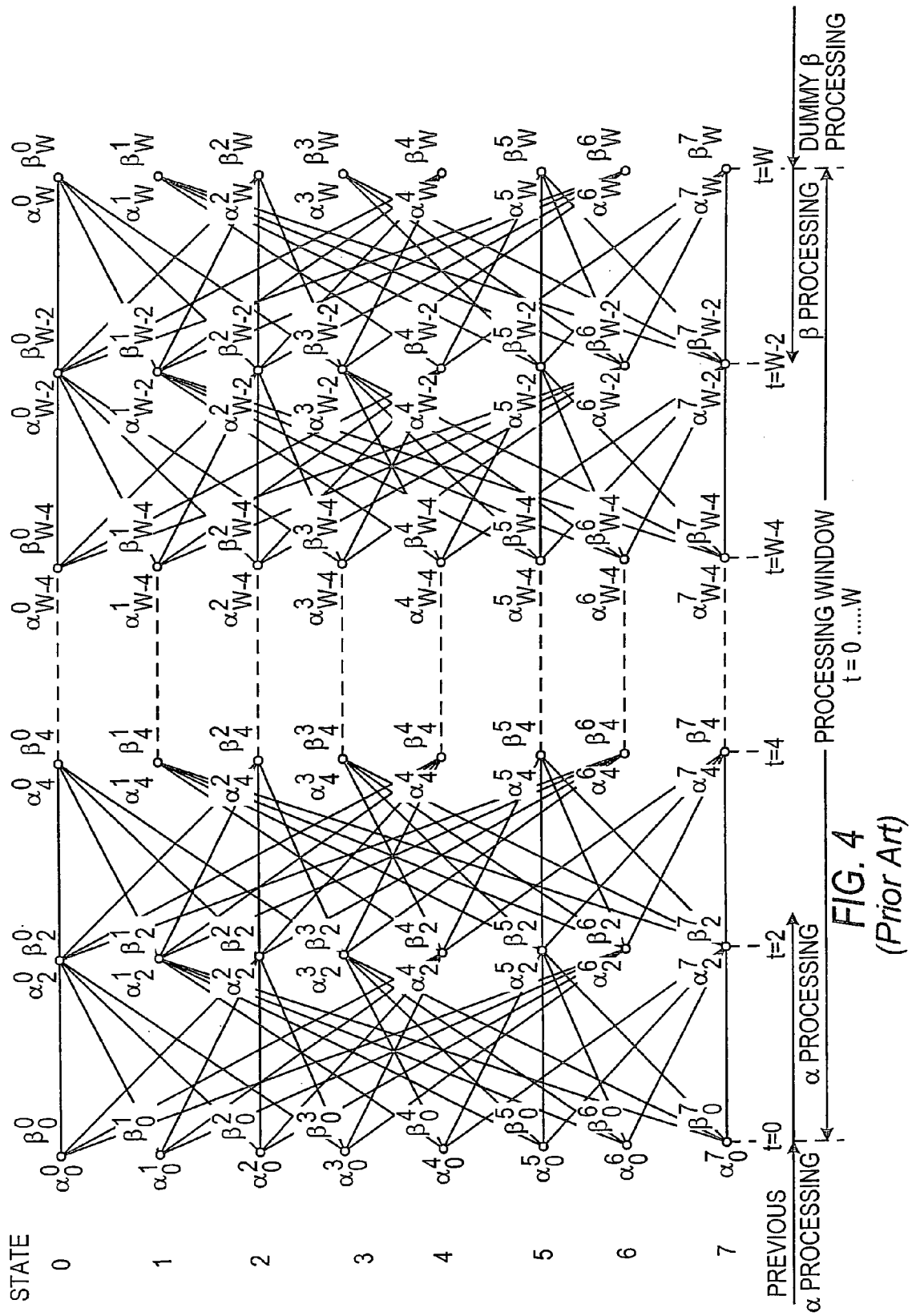
FIG. 4 shows the trellis structure for an 8-state Radix-4 trellis processing information over a time window of length W.

The turbo decoder of the present invention can also be implemented substantially similar to the PCCC decoder of FIG. 3 where Inner/Outer SISO processor 904 retrieves and provides soft information to deinterleaver 902 and interleaver 906 both of which are coupled to Inner/Outer SISO processor 904. Inner/Outer SISO processor 904 operates as per at least one trellis using the in place addressing technique.

Figure 6:
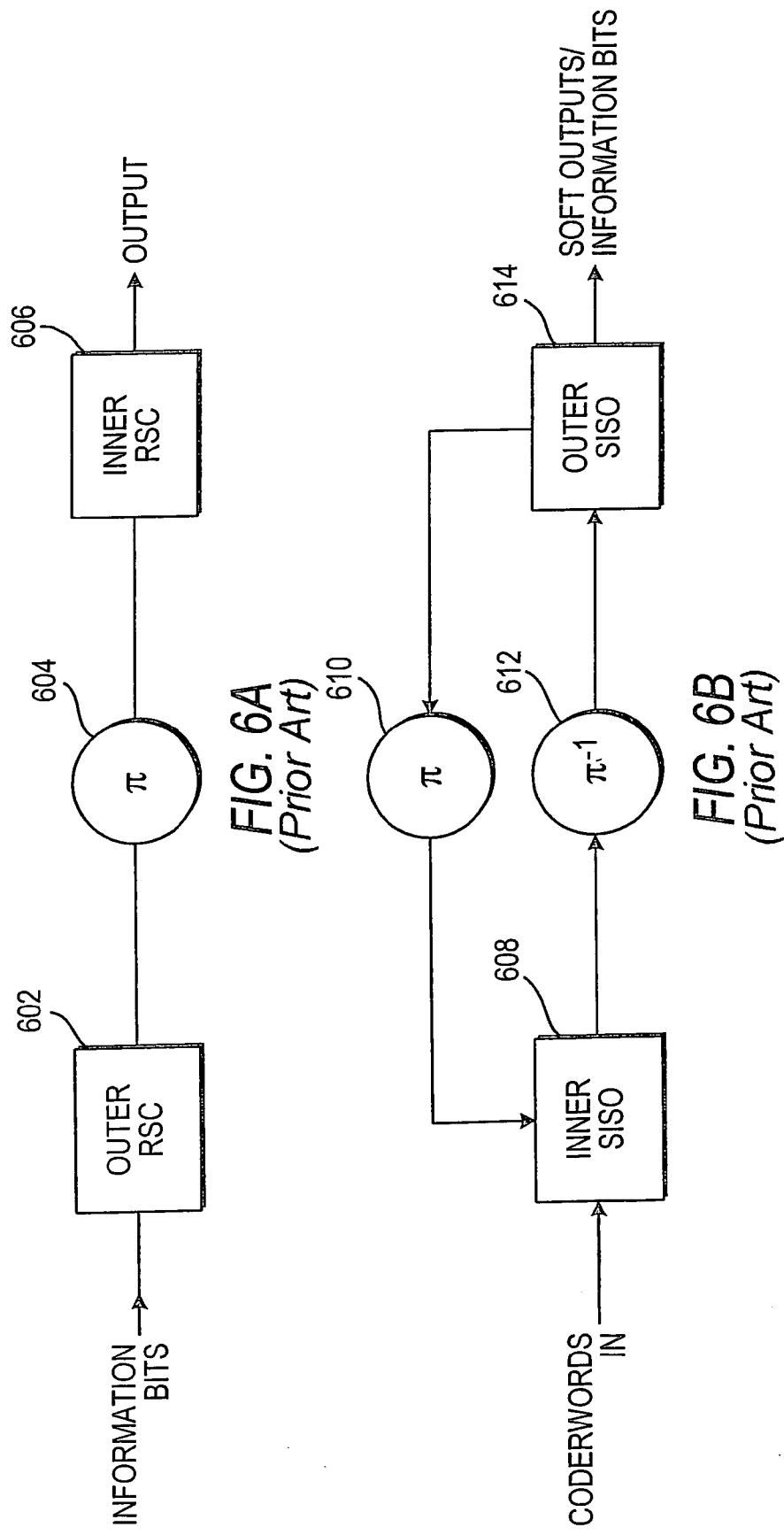
FIGS. 6A and 6B show the block diagrams for a serial turbo encoder and decoder respectively.
Figure 7:
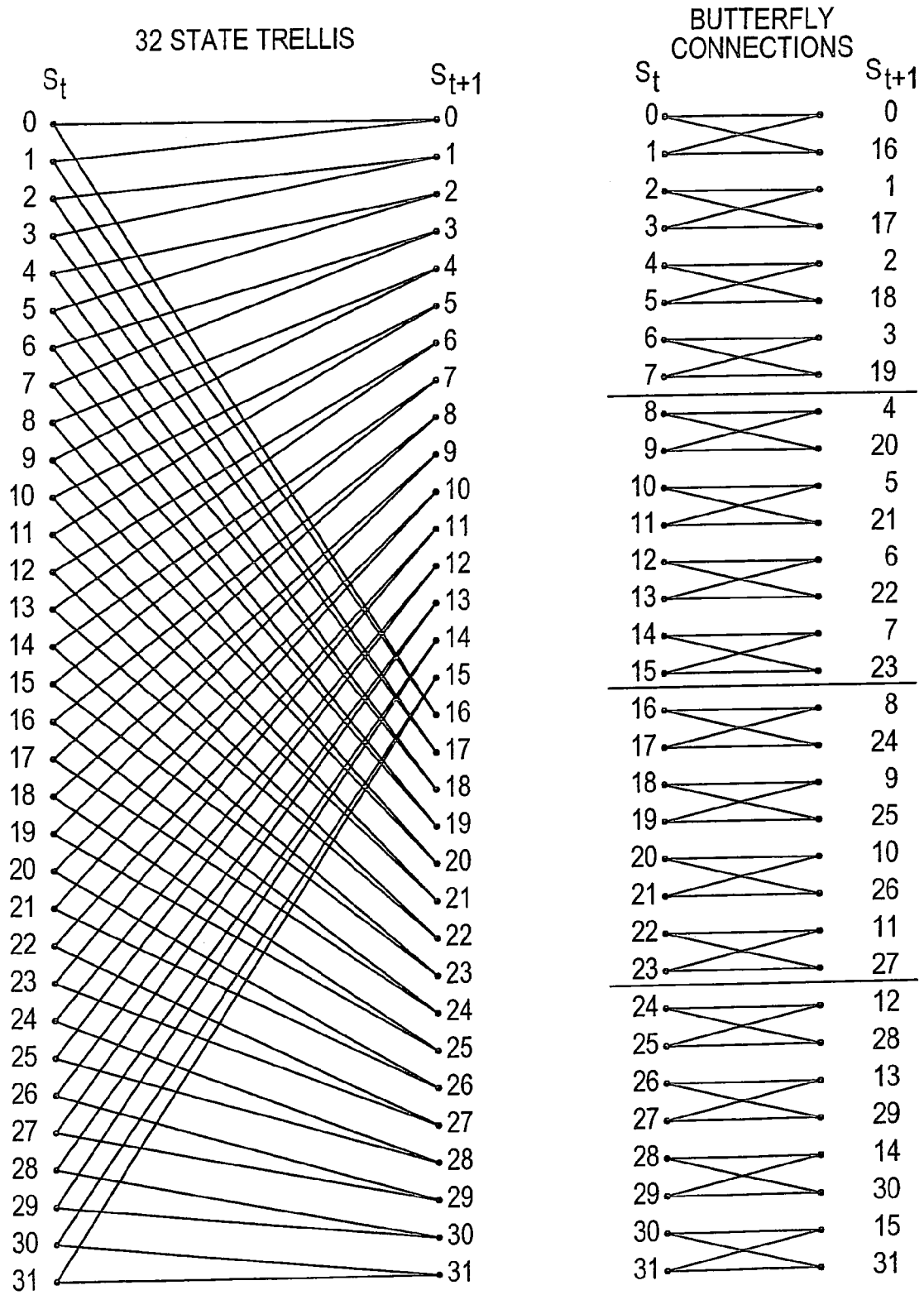
FIG. 7 shows the trellis structure for a 32-state radix-2 trellis.
Figure 8:
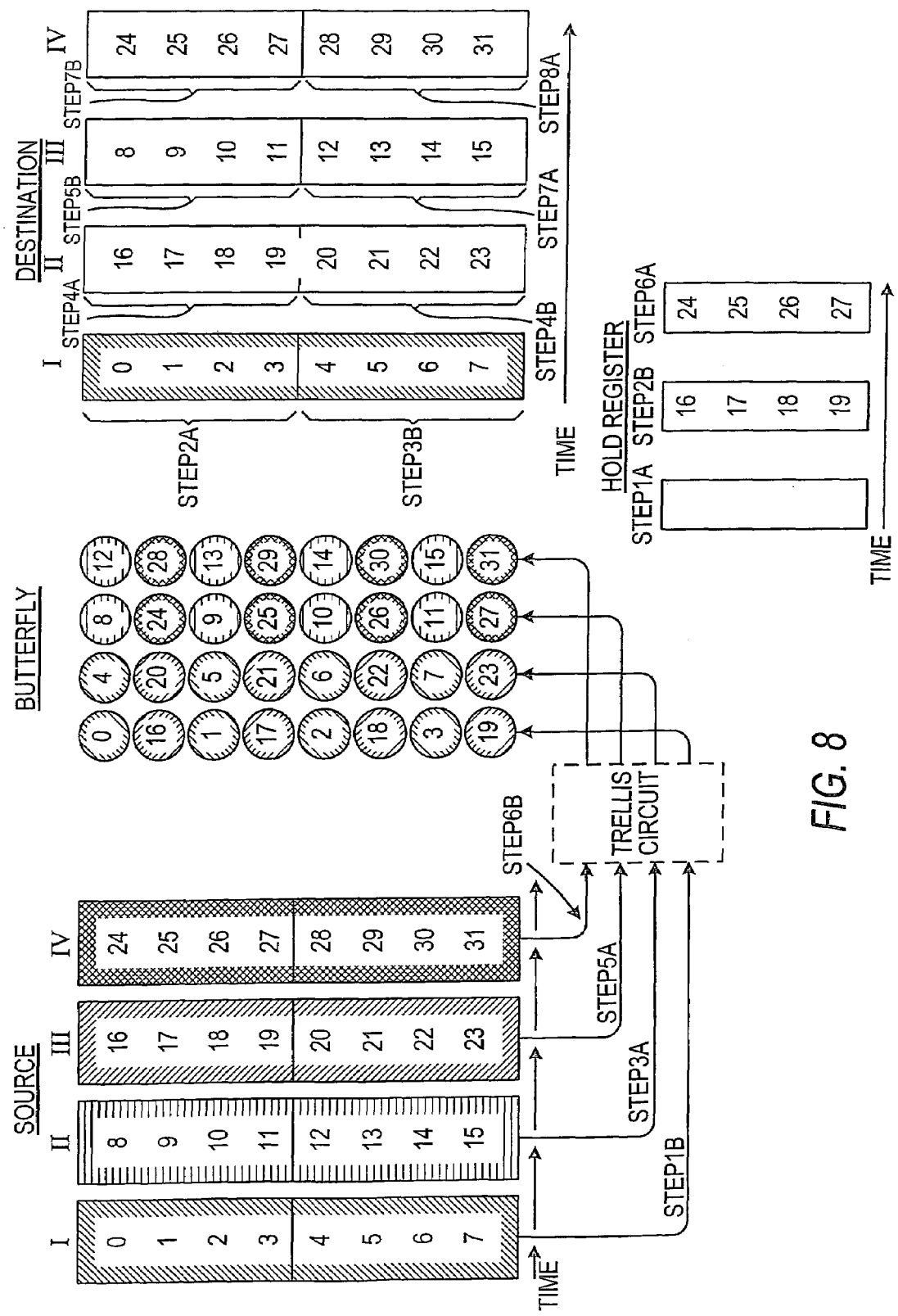
FIG. 8 graphically depicts the in-place addressing technique that could be included in decoders of the type shown in FIG. 6B to arrive at a decoder providing an aspect of the 5150 device described herein.

The second mode of operation is the serial mode in which Inner/Outer SISO processor 904, by applying an in-place addressing technique, performs as both an inner SISO and an outer SISO at different times during the processing of the codewords. Thus, the S/P-CCC decoder of the present invention operates as a SCCC decoder. Because of the use of the in place addressing technique, the inner SISO can operate as per a trellis that is different than the trellis used by the outer SISO. In this second or serial mode, Inner/Outer SISO processor 904 can be an inner SISO that processes information during certain clock cycles as per a first trellis having a certain number of states. The inner SISO processes code words from path 916. The inner SISO also receives soft information from interleaver 906 via path 912 and outputs soft information onto path 908 to deinterleaver 902. Continuing with the serial mode, Inner/Outer SISO processor can also be an outer SISO which processes information as per a second trellis having a certain number of states. The outer SISO outputs information (or soft outputs) onto path 918. The outer SISO receives soft information from deinterleaver 902 via path 910 and outputs soft information onto path 914 to interleaver 906. The outer SISO output information (or soft outputs) onto path 918. In essence, when operating as an SCCC decoder the S/P-CCC decoder of the present invention has a resulting architecture that operates substantially similar to that shown in FIG. 6B.

Figure 5:
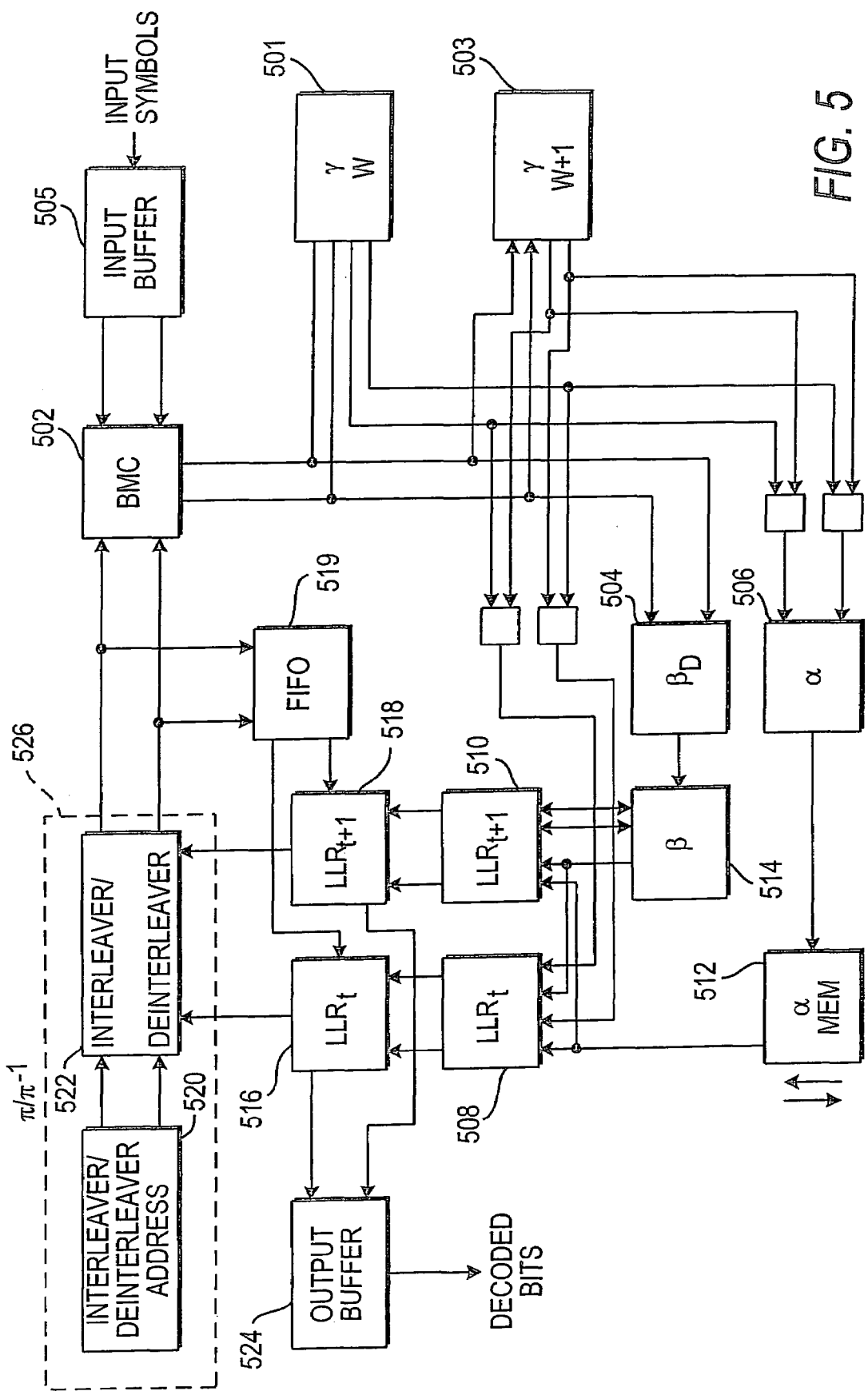
FIG. 5 shows the internal configuration of the SISO processor for the parallel turbo decoder shown in FIG. 1.

The first trellis associated with the inner SISO and the second trellis associated with the outer SISO may have the same number of states or different number of states. Likewise, the first trellis may have a certain radix that is the same or different than the radix of the second trellis. In general, the first trellis is an $N_1$-state Radix-K trellis. The second trellis is an $N_2$-state Radix-K trellis. $N_1$, may or may not be equal to $N_2$. K is an integer equal to 1 or greater. When the architecture shown in FIG. 5 is used for SISO 904, the radix K can be an integer equal to 1 or greater. $N_1$ and $N_2$ are integers equal to 2 or greater.

In both modes of operation the Inner/Outer SISO processor 904 may have an architecture substantially similar to that shown in FIG. 5 to allow it to traverse higher radix trellises, i.e., N-state, K-radix trellises where N is an integer equal to 2 or greater and K is an integer equal to 4 or greater. Thus, Inner/Outer SISO processor 904 enables decoder 900 of the present invention to process relatively more information when Inner/Outer SISO processor 904 is configured as shown in FIG. 5. When implemented as shown in FIG. 5, Inner/Outer SISO processor 904 uses Log Sum operators to calculate backward and forward path metrics from which log likelihood transition values are calculated. The difference between the calculated log likelihood transition values and extrinsic information provided by the interleaver/deinterleaver circuit is performed by subtractor circuits called LLR (Log Likelihood Ratio) circuits. The Log Sum operators are configured based on an Add Compare Select (ACS) architecture which implements the approximation of the Jacobian definition of the Log Sum operation. The particular SISO processor shown in FIG. 5 is an 8-state radix-4 processor. Because of the use of the in place addressing technique, Inner/Outer SISO 904 is able to traverse different trellises having different number of states and different radices.

The S/P-CCC decoder of the present invention can be implemented using hardware to calculate the path and branch metrics and to process information as per a trellis while using the in-place addressing technique discussed above. The S/P-CCC decoder of the present invention can also be implemented with a programmed general purpose computer or processor which performs the functions of the S/P-CCC decoder (including the interleaving and deinterleaving operations) based on programmed instructions. The paths coupling the Inner/Outer SISO processor can be electrical, electronic, magnetic, optical or any other paths used to convey signals.

The present invention can be implemented as a method in which the first step is to receive information or code words. The method has two mode of operations. In the first mode the method processes information to perform Serial Convolutional Code decoding and in the second mode the method perform Parallel Convolutional Code decoding. In both modes of operation the method uses an in-place addressing technique to process the received information as per a defined trellis. In particular, the received information is processed as per an N-state Radix-K trellis during which path metrics and branch metrics are calculated to allow the processing to traverse from one set of states to another set of states as defined by the trellis. As processing is performed per the trellis, the method can use all or a portion of the N states to perform the in-place addressing technique during a processing time period or a clock cycle. Further, as information is processed per the trellis, the method of the present invention uses a defined block of memory to retrieve and store states of the trellis; that is, the same memory block is used for storing and retrieving states. The SOURCE states are retrieved and the DESTINATION states are stored in the same memory block.

I claim:

1. A decoder comprising:
   an SISO device that operates as a PCCC decoder in a first mode of operation, and as an SCCC decoder in a second mode of operation where the device operates as per at least one trellis using an in-place addressing technique to process information.

2. The decoder of claim 1 where the device processes information in accordance with an algorithm.

3. The decoder of claim 2 where the algorithm is a Log MAP algorithm and the SISO device is a Log MAP processor.

4. The decoder of claim 1 where in the first mode of operation the SISO device operates as a first SISO during one time period and operates as a second SISO device during a second time period where the first and second SISO devices process information as per the same or different trellis.

5. The decoder of claim 1 where in the second mode of operation the SISO device operates as an inner SISO during one time period whereby it processes information as per a first trellis and operates as an outer SISO during another time period whereby it processes information as per a second trellis.

6. The decoder of claim 5 where the first trellis is a $N_1$-state Radix-K trellis and the second trellis is a $N_2$-state Radix-K trellis where $N_1$ may or may not be equal to $N_2$ and K, $N_1$ and $N_2$ are integers equal to 1 or greater.

7. The decoder of claim 1 where the SISO device comprises:
   at least one branch metric calculator;
   at least one forward path metric calculator and at least one backward path metric calculator where both calculators are in communication with the branch metric calculator;
   at least one Log Likelihood calculator coupled to the path metric calculators; and
   at least one subtractor circuit having an extrinsic information input and coupled to the at least one Log Likelihood calculator to provide at least one Log Likelihood ratio output whereby the path metric calculators and the at least one Log Likelihood calculator are constructed with Log Sum operators which are designed based on an approximation of a Jacobian definition of a Log Sum operation.

8. The decoder of chain 7 in which the information is processed as per an $N_1$ state Radix-K first trellis and an $N_2$ state Radix-K second trellis when operating as an SCCC turbo decoder where $N_1$ is not equal to $N_2$ and where $N_1$ and $N_2$ are integers equal to 2 or greater and K is an integer equal to 4 or greater.

9. The decoder of claim 7 in which the information is processed as per an $N_1$ state Radix-K first trellis and an $N_2$ state Radix-K second trellis where the SISO device is operating as a PCCC decoder and $N_1$ is equal to $N_2$ and K is an integer equal to 4 or greater and $N_1$, $N_2$ are integers equal to 2 or greater.

10. The decoder of claim 1 where the in-place addressing technique uses a block of memory for retrieving and storing values of the states of the trellis as the device processes the received information.

11. The decoder of claim 1 where information is processed using a portion of the states of the trellis to perform the in-place addressing technique during a clock cycle.

12. A method of performing turbo decoding, the method comprising the step of:
   processing, in accordance with a turbo decoding algorithm, received information as per an N-state Radix-K trellis using an in-place addressing technique where N, K are integers equal to 1 or greater.

13. The method of claim 12 where the received information is processed as per an N-state Radix-K trellis using an in-place addressing technique where N is an integer equal to 2 or greater and K is an integer equal to 4 or greater.

14. The method of claim 12 where the in-place addressing technique uses a block of memory to retrieve and store states of the trellis as information is processed per the trellis.

15. A decoder comprising:
   an interleaver;
   a deinterleaver; and
   a soft input soft output device in communication with the interleaver and the deinterleaver, the soft input output device being operative to use an in-place addressing techniques when processing path metric data related to each of the states of a trellis in accordance with a turbo decoding algorithm, whereby a block of memory storing the path metric data is sequentially processed in a plurality of equally sized groups in accord with a trellis processing algorithm, and whereby when data from a selected one of the groups is read from an associated group of memory locations in a current pass of the trellis processing algorithm, those memory locations are made available to receive and store output data from the trellis processing algorithm, and whereby output data from the trellis processing algorithm that is appropriately stored in memory locations of the selected group is stored in memory locations of the selected group and output data that is appropriately stored in a memory location of a second group, from which data has not been yet been read in the current pass of the trellis processing algorithm, the output data that is appropriately stored in a memory location of the second group is stored in a hold register and whereby when data from the second group is read from the associated second group of memory locations, those memory locations are made available to receive and store output data from the trellis processing algorithm and appropriate data from the hold register is copied into the newly available appropriate memory locations associated with the second group, whereby the same block of memory is used to store input data to the trellis processing algorithm and output data from the trellis processing algorithm and whereby an order of the plurality of groups of data may be rearranged within the block of memory, thereby facilitating the further processing of the data according to a butterfly mapping and thereby allowing the decoder to be used to process a trellis of arbitrary size.

* * * * *